(12) United States Patent
de Ridder et al.

(10) Patent No.: US 9,018,567 B2
(45) Date of Patent: Apr. 28, 2015

(54) WAFER PROCESSING APPARATUS WITH HEATED, ROTATING SUBSTRATE SUPPORT

(75) Inventors: Chris G. M. de Ridder, Almere (NL); Klaas P. Boonstra, Almere (NL); Theodorus G. M. Oosterlaken, Almere (NL); Barend J. T. Ravenhorst, Almere (NL)

(73) Assignee: ASM International N.V., Almere (NL)

( * ) Notice: Subject to any disclaimer, the term of this patent is extended or adjusted under 35 U.S.C. 154(b) by 735 days.

(21) Appl. No.: 13/181,791

(22) Filed: Jul. 13, 2011

(65) Prior Publication Data

US 2013/0017503 A1    Jan. 17, 2013

(51) Int. Cl.
    *F27D 5/00*    (2006.01)
    *H01L 21/67*    (2006.01)
    *F27B 17/00*    (2006.01)

(52) U.S. Cl.
    CPC ...... *H01L 21/67109* (2013.01); *F27B 17/0025* (2013.01)

(58) Field of Classification Search
    USPC .............. 432/247, 239, 241; 219/390, 444.1, 219/530; 118/730
    See application file for complete search history.

(56) References Cited

U.S. PATENT DOCUMENTS

| 6,732,911 | B2 * | 5/2004 | Matsuki et al. | 228/219 |
| 6,875,960 | B2 * | 4/2005 | Yamaguchi et al. | 219/462.1 |
| 7,351,057 | B2 * | 4/2008 | Berenbak et al. | 432/250 |
| 7,935,393 | B2 * | 5/2011 | Mizuno et al. | 427/523 |
| 8,337,622 | B2 * | 12/2012 | Suzuki et al. | 118/730 |
| 8,552,346 | B2 * | 10/2013 | Ambal et al. | 219/520 |
| 8,610,034 | B2 * | 12/2013 | Suzuki et al. | 219/444.1 |
| 2007/0243317 | A1 * | 10/2007 | Du Bois et al. | 427/98.9 |
| 2010/0224130 | A1 * | 9/2010 | Smith et al. | 118/725 |
| 2011/0014789 | A1 * | 1/2011 | Suzuki et al. | 438/680 |

FOREIGN PATENT DOCUMENTS

WO    WO 2004/008491    1/2004

* cited by examiner

*Primary Examiner* — Steven B McAllister
*Assistant Examiner* — Ko-Wei Lin
(74) *Attorney, Agent, or Firm* — Preti Flaherty Beliveau & Pachios LLP (57) ABSTRACT

A semiconductor substrate processing apparatus (1), comprising a substrate support assembly (30), including a substrate support (32) defining an outer support surface (34) for supporting a substrate or substrate carrier (24) thereon, and a heater (50) comprising a heat dissipating portion (54) that is disposed within the substrate support (32) and that extends underneath and substantially parallel to the support surface (34), said substrate support (32) being rotatably mounted around a rotation axis (L) that extends through said support surface (34), such that the support surface (34) is rotatable relative to the heat dissipating portion (54) of the heater (50).

18 Claims, 5 Drawing Sheets

WAFER PROCESSING APPARATUS WITH HEATED, ROTATING SUBSTRATE SUPPORT

FIELD OF THE INVENTION

The present invention relates to the field of semiconductor processing, and more in particular to a semiconductor processing apparatus including a heated, rotating substrate support.

BACKGROUND

The simultaneous processing of a plurality of semiconductor wafers in a vertical batch furnace presents the problem of how to subject all wafers that are stacked into a wafer boat to substantially the same process conditions across their respective surface areas. One such process condition is the exposure to process gases. To promote the uniformity of this exposure, a vertical furnace is commonly equipped with a boat rotation mechanism that rotates the wafer boat during processing so as to average out non-uniformities in process gas flows that contact the wafers. Another process condition is the temperature of the wafers. To obtain uniform processing results across the substrates of a batch, each of the wafers thereof may preferably be heated substantially uniformly to a common temperature by heating means disposed proximate a side wall of the process chamber and proximate a top wall of the process chamber. As regards in particular the upper wafers in the wafer boat, the wafer-to-wafer temperature uniformity is generally not a significant problem, while the within-wafer temperature uniformity (due to asymmetries in the construction of the furnace) may be enhanced by the aforementioned boat rotation. However, in a vertical batch furnace the temperature of the lower substrates in the wafer boat proves difficult to control. This is partly due to the fact that they are located closely to the relatively cold lower door zone of the furnace. To mitigate the effect of their location, a pedestal supporting the wafer boat from below may be provided with additional heating means for heating the lower wafers. Although such heating means may increase the wafer-to-wafer temperature uniformity across the wafers of the batch, any non-uniformities in the heating means and/or the heat profile they produce may easily affect the within-wafer temperature uniformity of the lower wafers.

To overcome this problem, WO 2004/008491 (Dubois et al.) suggests to fit the vertical furnace with a magnetically coupled wafer rotation system for rotating the wafer boat relative to the stationary pedestal. The rotation mechanism includes a drive shaft that extends vertically inside the pedestal. The lower end of the drive shaft is magnetically coupled to a rotating motor, while the upper end, which resides in a top portion of the pedestal, is magnetically coupled to a support that is connected to the wafer boat and that itself is supported on the pedestal. The rotating motion of the motor may thus be transferred magnetically onto the (lower end of the) drive shaft, and from the (upper end of the) drive shaft onto the support of the wafer boat. In use, the boat is to be rotated relative to the pedestal so as to average out any effects the non-uniformities in the heating element may have on the temperature of the lower substrates. Remarkably, WO '491 is silent about a bearing mechanism between the pedestal and the boat. Such a bearing mechanism is understood to be an essential component of the wafer rotation mechanism. Moreover, it is a non-trivial component, in particular because the bearing mechanism would reside in the high-temperature processing environment of the furnace, which may be rich in chemical reactants that can soil and attack the bearing to shorten its life span significantly. It therefore seems that WO '491 merely discloses a speculative and non-enabling solution to the aforementioned problem.

SUMMARY OF THE INVENTION

It is an object of the present invention to provide for a semiconductor substrate processing apparatus and method that enable the uniform heating of one or more substrates, despite non-uniformities in (the heat profile produced by) a heating element that is incorporated in a substrate support that supports the substrates.

To this end, a first aspect of the invention is directed to a semiconductor substrate processing apparatus. The apparatus includes a substrate support assembly comprising a substrate support defining an outer support surface for supporting a substrate or substrate carrier thereon, and a heater comprising a heat dissipating portion that is disposed within the substrate support and that extends underneath and substantially parallel to the support surface. The substrate support is rotatably mounted around an rotation axis that extends through said support surface, such that the support surface is rotatable relative to the heat dissipating portion of the heater.

A second aspect of the invention is directed to a method. The method includes providing a semiconductor processing apparatus according to the first aspect of the invention. The method further includes providing at least one substrate, and supporting said at least one substrate on the support surface of the substrate support, possibly through intermediation of a substrate carrier. The method also includes simultaneously (i) heating the heater so as to make the heat dissipating portion of the heater dissipate heat, and (ii) rotating the substrate support around its rotation axis so as to rotate the at least one substrate supported on the support surface thereof relative to the heat dissipating portion of the heater beneath it.

The method and apparatus according to the invention feature a substrate support assembly, including a rotatable substrate support with an integrated or internal heater. The substrate support, and any substrates supported thereon (either directly or through the intermediation of a substrate carrier), may be rotated around the rotation axis of the substrate support and relative to the heater. Such rotation averages out the effects of non-uniformities in the (heat profile of) the heater, and promotes the within-substrate temperature uniformity of the supported substrates. The apparatus and method according to the present invention may be applied in a variety of semiconductor processing devices, including in particular vertical thermal batch furnaces and single substrate processing apparatus comprising a rotatable substrate support or susceptor; see for an example of the latter type of device US 2010/0224130 (Smith et al.).

Compared to the aforementioned vertical batch furnace of WO 2004/008491 (Dubois et al.), the presently disclosed apparatus presents a clear improvement. As mentioned, one of the problems of WO '491 is that a wafer boat is to be rotated relative to a stationary pedestal comprising a stationary heater. This requires that a bearing be disposed between the boat and the pedestal, which bearing thus resides in the reaction space of the furnace. Accordingly, the bearing is subject to essentially the same process conditions as the (lower) substrates in the wafer boat, which will negatively affect its operation. In the proposed apparatus no bearing is required between the support surface of the substrate support and the substrate carrier placed thereon because the substrate support or pedestal itself is rotatable. Instead, the apparatus may make use of a bearing that enables rotation between the substrate support and the fixed world, but this bearing may be disposed well outside of the reaction space.

In a preferred embodiment of the apparatus, the heater may be non-rotatably mounted with respect to the rotation axis of the substrate support. That is to say that the heater, in a fully assembled, operational state of the apparatus, is non-rotatable around the rotation axis (as will become clear below, a non-rotatably mounted heater may in fact appear to be rotatably mounted in a partly assembled, non-operational state of the apparatus). A non-rotatable or stationary heater configuration generally simplifies the construction the apparatus. In the case of an electrical heater, for example, it overcomes the need to use high-power sliding/wiper electrical contacts for connections between the heater and an electrical power supply. Instead, fixed and wear-resistant connections may be used. Accordingly, a non-rotatably mounted heater is easier and more economical to construct, and more reliable and less maintenance sensitive during its life span.

Still, a non-rotatably mounted heater configuration is not the only configuration contemplated. For instance, in another embodiment of the apparatus the heater may also be rotatably mounted, preferably around the rotation axis of the substrate support, but the apparatus may be configured such that, during operation, the heater and the substrate support cannot have substantially the same non-zero angular velocity. That is, the heater may be adapted to rotate during use, but only at an angular velocity that is either greater or smaller than the angular velocity of the substrate support, which effectively implies relative motion between the substrate support surface and the heater. To this end, the rotation of the heater may, for example, be coupled to that of the substrate support by means of a gear mechanism or transmission, or through a fluid (drag) coupling. Alternatively, the heater may be driven independently of the substrate support, i.e. without a mechanical coupling between the two parts that transfers power/rotational motion between them.

These and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
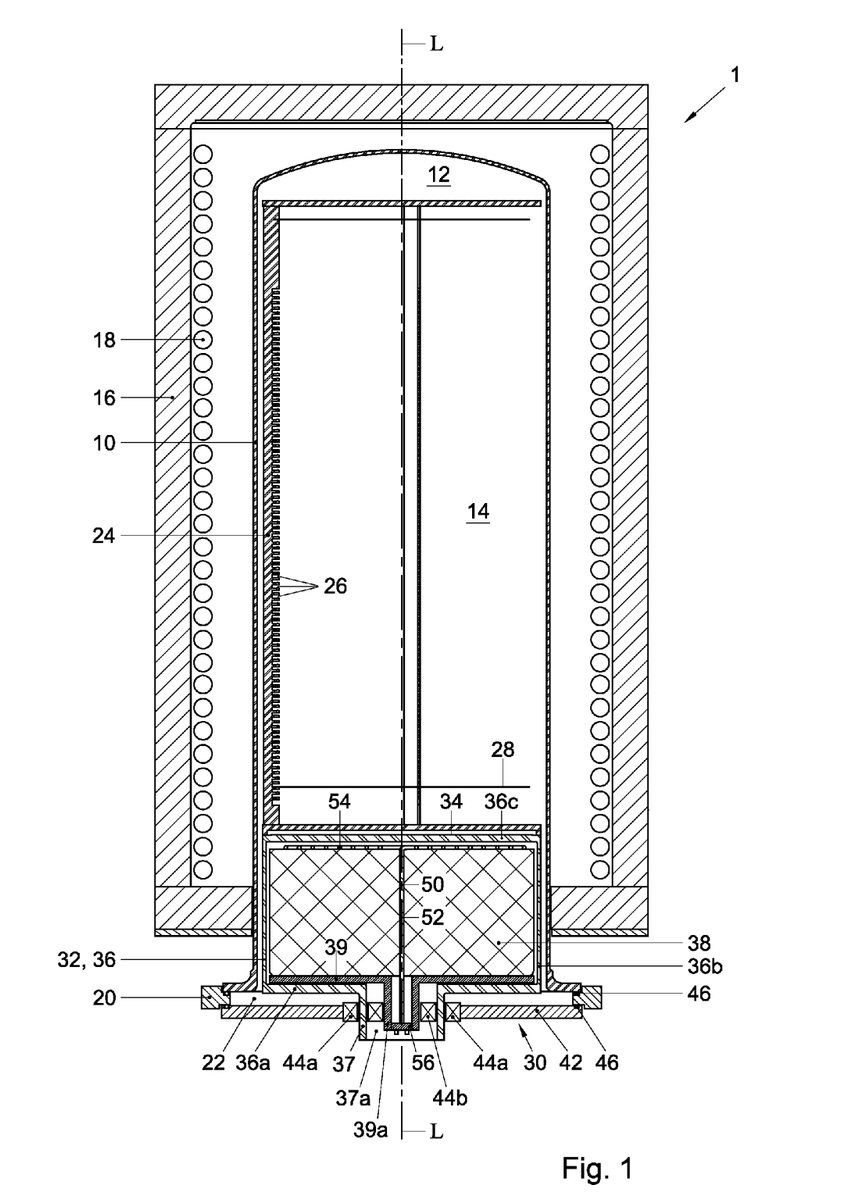
FIG. 1 is a schematic cross-sectional side view of a portion of a first exemplary embodiment of a vertical thermal batch furnace according to the present invention, including a substrate support assembly with a substrate support that is rotatable around a heater accommodated therein.
Figure 2:
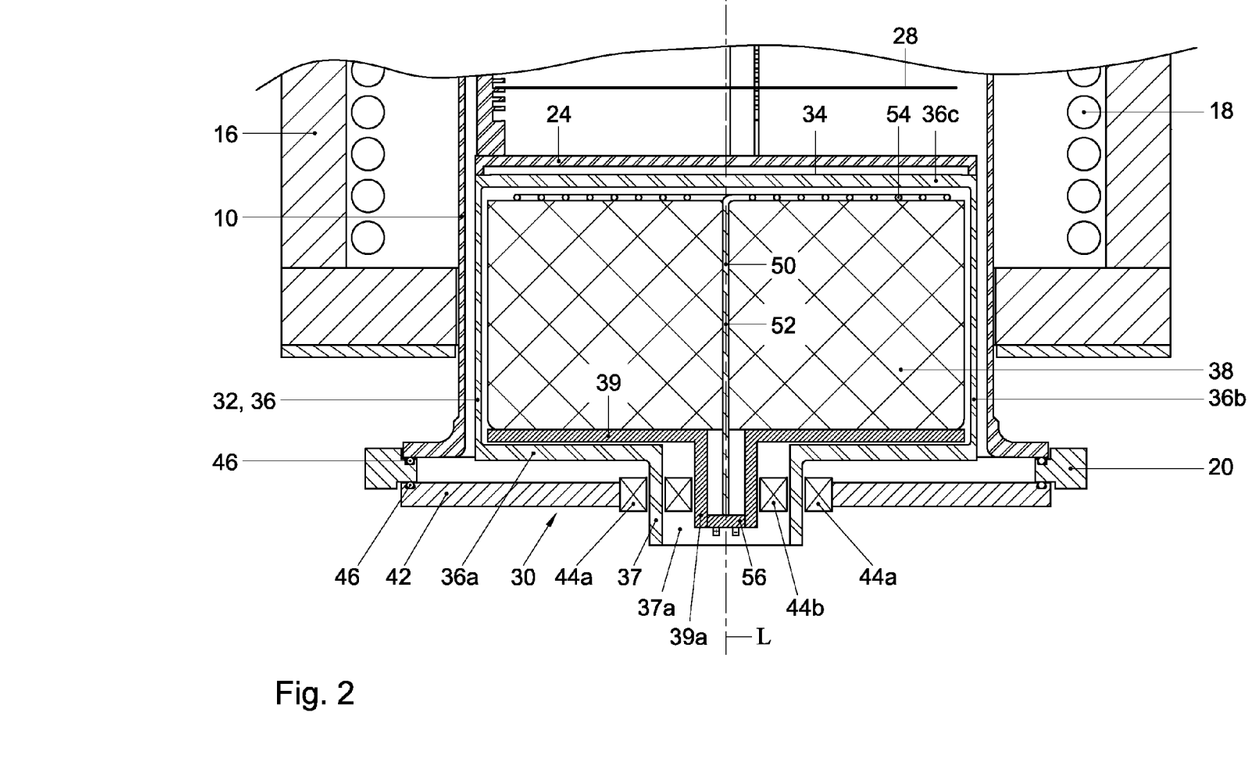
FIG. 2 is an enlarged cross-sectional side view of the substrate support assembly of the vertical thermal furnace shown in FIG. 1.
Figure 3:
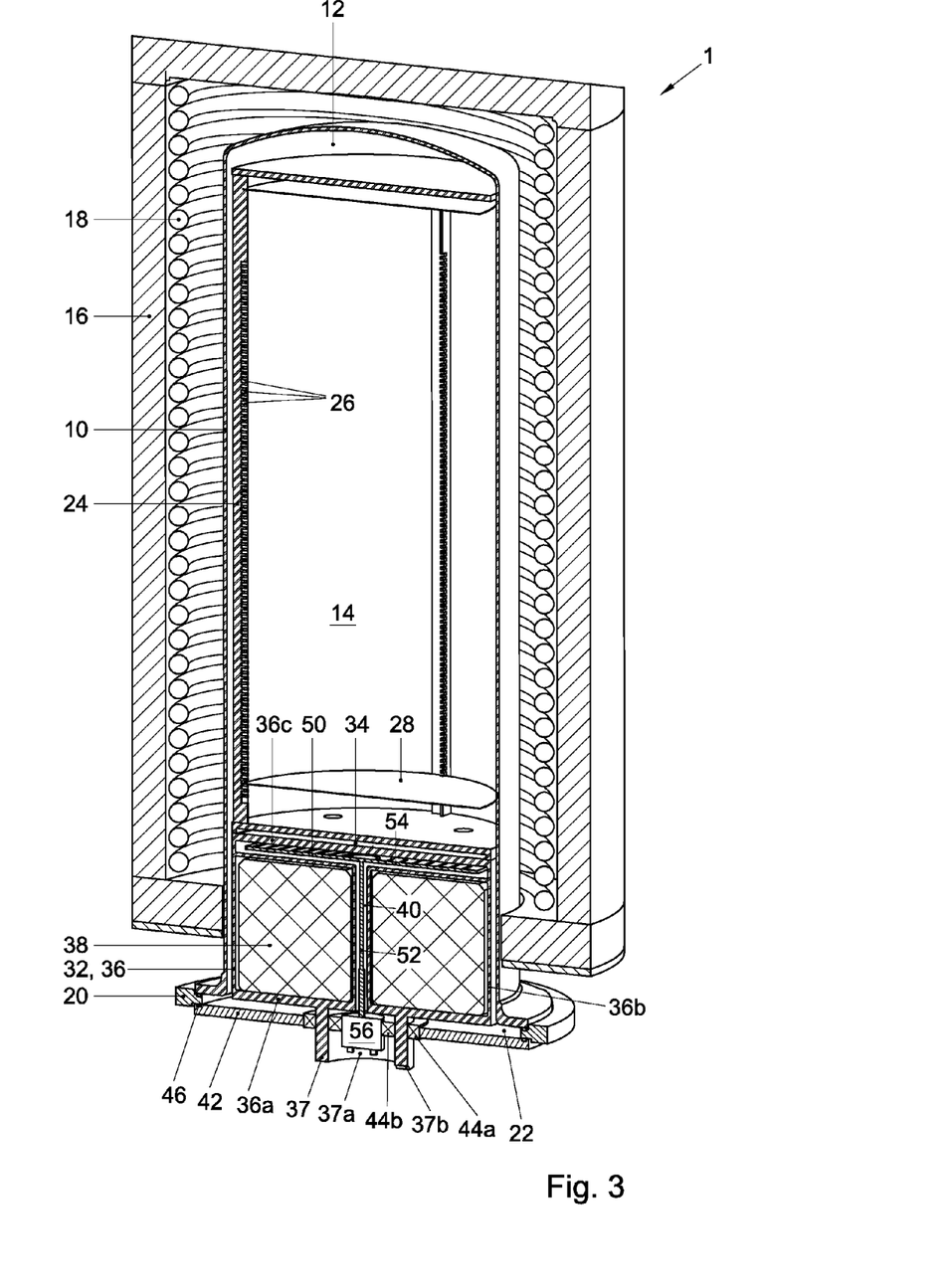
FIG. 3 is a schematic cross-sectional perspective view of a portion of a second exemplary embodiment of vertical thermal batch furnace according to the present invention, including a substrate support assembly with a substrate support that is rotatable around a heater accommodated therein.
Figure 4:
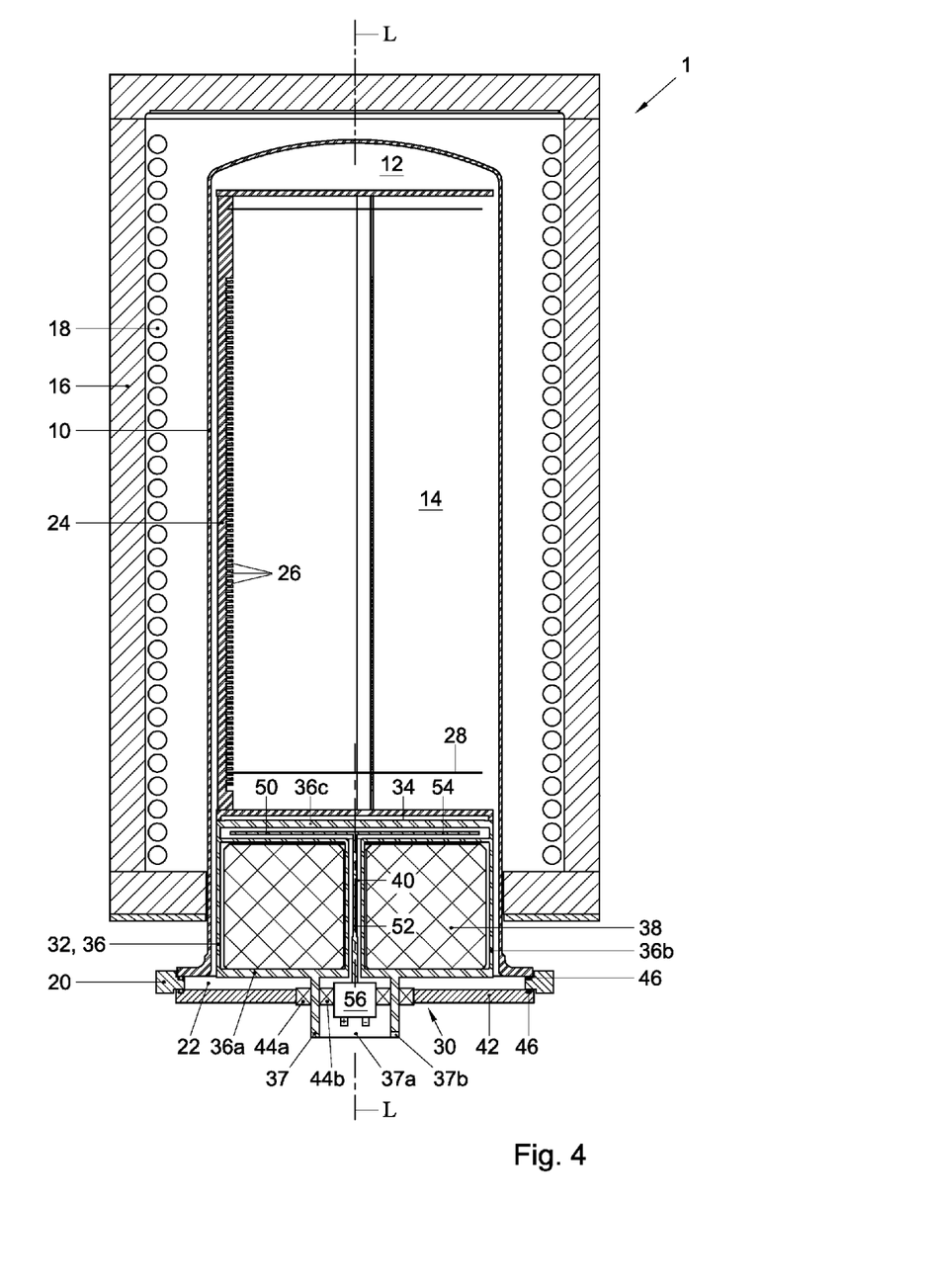
FIG. 4 is a schematic cross-sectional side view of the vertical thermal furnace shown in FIG. 3.
Figure 5:
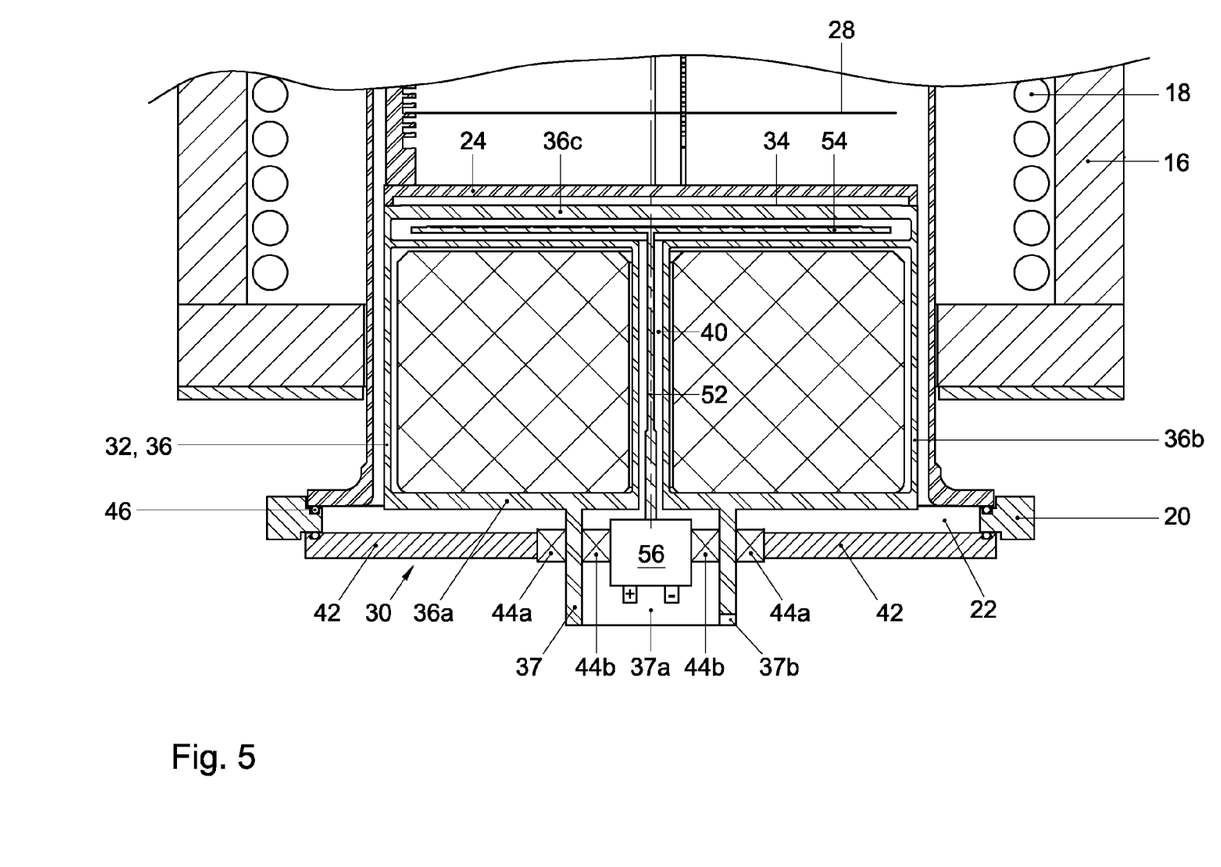
FIG. 5 is an enlarged cross-sectional side view of the substrate support assembly of the vertical batch furnace shown in FIGS. 3 and 4.

FIGS. 1 and 2 schematically illustrate in cross-sectional side views an upper portion of a first exemplary embodiment of a vertical thermal batch furnace 1 in accordance with the present invention. FIGS. 3-5 schematically illustrate in cross-sectional perspective and side views an upper portion of a second, alternative exemplary embodiment of a vertical thermal furnace 1 in accordance with the present invention. The construction of both embodiments will be discussed below in general terms, and with reference to the respective Figures.

In general, aside from the substrate support assembly 30 to be described hereafter, a vertical thermal furnace 1 in accordance with the present invention may be of a conventional design. It may, for instance, be of a single (or double, not shown) tube type and include a generally bell jar-shaped reaction tube 10. The reaction tube 10 may have a generally tubular, for example circular or polygonal, cross-sectional shape, and extend along a central axis L. As regards the manufacturing material, the reaction tube 10 may be made of quartz, silicon carbide, silicon or another suitable heat resistant material. The reaction tube 10 may delimit a reaction chamber 12 defining a reaction space 14 in which substrates can be processed, e.g. be subjected to thermal annealing or deposition treatments. The reaction tube 10 may be encircled by heating means for heating substrates received in the reaction space 14, such as an electrically resistive heating coil 18 that is powered by an electrical power supply (not shown). The heating means 18 may be secured to a thermally insulating sleeve 16 that surrounds the reaction tube 10. At its lower, open end the reaction tube 10 may be supported on a typically stainless steel flange 20 that defines a central furnace opening 22 via which a wafer boat 24 may enter and/or exit the reaction chamber 12.

The wafer boat 24 may be fixedly mounted on a support surface 34 of a substrate support or pedestal 32 of a substrate support assembly 30. It may be of a conventional design, and include a plurality of vertically spaced apart slots 26 for holding equally many semiconductor wafers 28, only one of which is shown in each of the Figures.

To enable rotation of the wafer boat 24 during processing, the substrate support 32 on which the wafer boat 24 is disposed may be rotatably mounted around the central axis L of the furnace 1. The substrate support assembly 30 may further include a heater 50 that extends at least partly within the substrate support 32 and underneath the support surface 34, so as to facilitate the heating of the lower substrates 28 in the wafer boat 24. In order to allow the substrate support 32 to be rotated relative to the heater 50 to average out the effects of non-uniformities in the (heat profile of) the heater, the substrate support assembly 30 may be configured such that a rotation of the substrate support 32 around its rotation axis L involves relative motion between the substrate support surface 34 and the heater 50. Such a configuration may be effected in different ways as is illustrated by the alternative embodiments of FIGS. 1-2 and FIGS. 3-5, respectively, which will now be elucidated in turn.

Referring first to the configuration of the embodiment of FIGS. 1-2. The substrate support 32 may include a cylindrical container 36 that is centered around the rotation axis L. The container 36 may include a substantially flat bottom wall 36a, a cylinder jacket-shaped side wall 36b, and a substantially flat top wall 36c, which walls may be interconnected to form the container 36. The top wall 36c may provide for the outer, upward facing support surface 34, through which the rotation axis L may extend, preferably perpendicularly thereto.

The body of the container 36, extending between the bottom wall 36a and the top wall 36c, may define an interior space that may be at least partly filled with a thermally insulating material 38, such as Fibrothal® of Kanthal, e.g. Fibrothal F17. The insulating material 38 may serve as a heat shield for both the door plate 42 and the flange 20, and help to reduce heat loss via the lower portion of the furnace 1.

The insulating material 38 may not rest directly on the bottom wall 36a of the container 36, but instead be supported on a support plate 39 that is disposed within the container 36, just above and free of the bottom wall 36a thereof. To enable this 'floating construction', the bottom wall 36a of the container 36 may be provided with a hollow, substantially cylinder jacket-shaped drive shaft 37 that is centered on the rotation axis L. The drive shaft 37 may protrude downwardly from the bottom wall 36a, and define a passage 37a therethrough. The support plate 39 may similarly be provided with a substantially cylinder jacket-shaped support shaft 39a that protrudes downwardly from the support plate 39. The support shaft 39a may extend coaxially with the drive shaft 37, and define a passage through the support plate 39. A bearing 44b may be provided between the drive shaft 37 and the support shaft 39a, such that the bearing 44b engages an inner circumference of the drive shaft 37 (or is at least disposed within the drive shaft passage 37a) and an outer circumference of the support shaft 39a. The bearing 44b may bear or support the support plate 39, and facilitate rotation of the container 36 around it.

The cylindrical container 36 may be connected to and supported on a base assembly of the substrate support assembly 30, which may include a doorplate or seal cap 42 of the furnace 1. The cylindrical container 36 may be rotatably mounted on this base assembly 42 by means of a bearing 44a, which, like the bearing 44b, may be of any suitable type, e.g. a roller-, fluid- or magnetic bearing. Both bearings 44a, 44b may preferably be roller bearings defining circular, coaxial races. The bearing 44a may preferably connect to the container 36 at a lower end thereof (i.e. an end distal to the substrate support surface 34), such that the bearing 44 is disposed substantially below the substrate support 32 and it is shielded from a process atmosphere to which substrates 28 supported on the support surface 34 are to be subjected. In the depicted embodiment, the bearing 44a engages an outer circumference of the drive shaft 39a that protrudes from the bottom wall 36a of the container 36. The cylindrical container 36 may thus be rotated relative to both the doorplate 42 (over bearing 44a) and the support plate 39 (over bearing 44b).

As mentioned, the substrate support 32 may further accommodate a heater or heating element 50. The heater 50 may generally comprise a heat dissipating/generating portion 54 configured to dissipate/generate the desired heat inside substrate support 32, and a connecting portion 52 that connects to the heat dissipating portion 54 to transfer energy to it from outside the substrate support 32. The heater 50 may be of any suitable type. It may, for instance, be configured to transfer heat into the substrate support 32, e.g. by conduction or circulation of a heated fluid. In a preferred embodiment, however, the heater 50 may be an electrically resistive heater.

In the embodiment of FIGS. 1-2, an electrically resistive heater 50 is disposed in a fixed stationary relationship to the thermally insulating material 38. The heat dissipating portion 54 of the heater may include one or more electrically resistive heating spirals that, seen from the central axis L, extend radially outwards in a plane located beneath, substantially parallel to, and adjacent to (e.g. within a distance of 25 cm of, and preferably within a distance of 10 cm of) the top wall 36c of the container. The heat dissipating portion 54 may preferably extend across an area that is substantially equal to an area of the support surface 34 so as to enable the heating of the (the lower) wafers 28 in the wafer boat 24 supported thereon across their entire surfaces.

In order to optimize the temperature uniformity of the lower wafers further, the heater 50 may define more than one independently controllable heating zone. Each heating zone may be associated with a (sub-)heat dissipating portion, e.g. one electrically resistive heating spiral, of the heater 50 that extends underneath only a part of the substrate support surface 34. A first zone may, for instance, extend underneath a central region of support surface 34 and a second zone may extend underneath an outer region of support surface 34. In another embodiment a first zone may extend over a first tangentially extending region of support surface 34 and a second zone may extend over a second tangentially extending region of support surface 34.

For support, the heat dissipating portion 52 of the heater 50 may rest on top of the thermally insulating material 38 provided in the container 36. The connecting portion 52 of the heater 50 may provide for electrical leads to and from the spirals of the heat dissipating portion 52, preferably one pair of leads per spiral to enable each of the associated heating zones to be controlled independently. It may connect to the heat dissipating portion 54 at a center of the heating spirals and extend downwardly therefrom along the central axis L, through the thermally insulating material 38 in which it may be embedded, and into the support shaft 39a of the support plate 39. There the connecting portion 52 may be mounted on or end in a plug 56 that may be fixedly integrated with the lower end of the support shaft 39a. It is understood that the connecting portion 52 of the heater 50 may preferably be non-heat dissipating/generating.

In the above, the base assembly was introduced as including a door plate 42 of the furnace 1. In practice, it may additionally comprise a movable loader or support arm (not shown). The loader arm may be disposed below the doorplate 42 in order to support it, and therewith the substrate support 32, and to enable raising and lowering of the substrate support 32 into and from the reaction chamber 12 of the furnace 1 at the beginning and end of a treatment, respectively. The loader arm may comprise a central socket configured to receive the lower end of the support shaft 39a, including the plug 56 at the lower end of the connecting portion 52 of the heater 50 integrated therein. The socket may preferably be configured to serve as an arrest device that prevents rotation of the received plug 56 around the rotation axis L. Accordingly, when the door plate 42 is supported on the loader arm, the doorplate 42 and the support plate 39 may be held in a fixed stationary relation, while the substrate support 32 may be rotatably mounted between them. To rotate the cylindrical container 36 of the substrate support 32 around its rotation axis L, the base assembly may additionally include a motor drive, which may be integrated in the loader arm. The motor drive may engage the drive shaft 39a of the cylindrical container 36 so as to rotate it, and the wafer boat 24 supported thereon, in unison. The base assembly and the rest of the fixed, non-rotatably mounted structure of the furnace 1, including the support plate 39, the insulation material 38 and the heater 50, will remain stationary during rotation of the substrate support 32.

Referring now to FIGS. 3-5 which illustrate an alternative embodiment of the substrate support assembly 30. This second exemplary embodiment differs from that of FIGS. 1-2 in that the thermally insulating material 38 is in a static relation to the container 36 of the substrate support 32, which requires the heater 50 to be self-supporting as will be elucidated below.

In the embodiment of FIGS. 3-5 the body of the container 36, extending between the bottom wall 36a and the top wall 36c, may define two body parts. A first body part, adjacent the top wall 36c, may define an interior space for receiving a heat dissipating portion 54 of the heater 50. A second body part, adjacent the bottom wall, may define an interior annular space around the rotation axis L that may be at least partly filled with thermally insulating material 38. It will be clear from FIGS. 3-5 that the second embodiment of the furnace 1 does not include a support plate 39 to support the thermally insulating material 38. Instead, the thermally insulating material 38 rests directly on the bottom wall 36c of the container 36, such that it is in a fixed, stationary relationship therewith. That is, the insulating material 38 will move in unison with the container 36 when the latter is rotated.

To allow the container 36 to be rotated relative to heater 50, the container 36 may define a hollow shaft 40 that extends from the first body part, through the second body part and the thermally insulating material 38 provided therein, and in line with the central passage 37a of the drive shaft 37 on the bottom wall 36a of the container 36.

The heater 50 may again comprise a connecting portion 52 and a heat dissipating portion 54. The connecting portion 52 may have an elongate or straight shape with a first, lower end and a second, upper end. The lower end of the connecting portion 52 may be mounted on a plug 56 that is located inside the central passage 37 of the drive shaft 37, and that may be supportingly connected to the drive shaft 37 through a bearing 44b. From the plug 56 the connecting portion 52 may freely extend upward through the hollow shaft 40. Where the second, upper end of the connecting portion 54 clears the shaft 40, it may connected to the heat dissipating portion 54. The heat dissipating portion 54 may again be substantially planar, and extend in a plane beneath, adjacent to and parallel to the support surface 34, and preferably cover an area that is substantially equal to an area of the support surface 34. The heater 50 of the embodiment of FIGS. 3-5 is self-supporting in the sense that, apart from its bearing connection to plug 56, there is no external physical support to ensure that it maintains its position or configuration. The heater 50 does in particular not mechanically contact the thermally insulating material inside the rotatably mounted container 36 of the substrate support 32.

As in the first embodiment of FIGS. 1-2, the doorplate 42 may be supported on a loader arm (not shown), which may comprise a socket configured to arrestingly receive the plug 56. When the loader arm is in place, its motor may engage the drive shaft 37 of the substrate support 32, for example through a drive ridge recess 37b provided therein, and drive it to rotate the substrate support 32 and the wafers 28 supported thereon relative to both the heating means 18 and the heat dissipating portion 54 of the heater 50, thereby averaging out the effects that non-uniformities in the heating profile of the heating means 18 and heat dissipating portion 54 of the heater 50 may have on the wafers.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

In this regard it is noted that the application of the present invention is not limited to vertical thermal furnaces. US 2010/0224130 (Smith et al.), for example, describes an apparatus for processing a single substrate utilizing a rotating substrate support. The disclosed apparatus includes a chamber having a substrate support assembly disposed within the chamber. The substrate support assembly includes a substrate support having a support surface and a heater disposed beneath the support surface. A shaft is coupled to the substrate support, and a motor is coupled to the shaft through a rotor to provide rotary movement to the substrate support. Since the heater is rigidly integrated with(in) the substrate support such that a rotation of the substrate support entails an identical rotation of the heater, a substrate supported on the support surface of the substrate will not rotate or otherwise move relative to the heater during processing. Accordingly, any non-uniformities in the thermal field produced by the heater may result in undesirable variations in the temperature distribution within the substrate. It will be clear that the present invention may be applied to the single-substrate processing apparatus of US '130 to overcome this problem.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS 1 vertical thermal processing furnace/reactor
10 reaction tube
12 reaction chamber
14 reaction space
16 thermally insulating sleeve
18 electrically resistive coil
20 flange
22 central furnace opening
24 wafer boat
26 wafer reception slot
28 wafer
30 substrate support assembly
32 substrate support/pedestal
34 support surface
36 cylindrical container
36a,b,c bottom wall (a), side wall (b) and top wall (c) of container
37 drive shaft of container
37a axial passage through drive shaft of container
37b radial passage through drive shaft of container
38 thermally insulating material
39 support plate
39a support shaft
40 hollow shaft through thermally insulating material
42 door plate
44a bearing between door plate and container
44b bearing between container and heater bushing
46 elastomeric O-rings
50 heater
52 connecting portion of heater
54 heat dissipating/generating portion of heater
56 plug
L central axis

We claim:
1. A semiconductor substrate processing apparatus, comprising:
a reaction chamber defining a reaction space,
a substrate support assembly, including:

a substrate support defining an outer support surface for supporting a substrate or substrate carrier thereon; and a heater comprising a heat dissipating portion that is disposed within the substrate support and that extends underneath and in a direction parallel to the support surface, a base assembly including a doorplate for sealing the reaction space of the apparatus, said substrate support being rotatably mounted around a rotation axis that extends through said support surface, such that the support surface is rotatable relative to the heat dissipating portion of the heater, wherein the substrate support is connected to the base assembly through a first bearing that facilitates rotation of the substrate support relative to the base assembly around the rotation axis.

2. The apparatus according to claim 1, wherein the heater is connected to the substrate support through a second bearing that facilitates rotation of the substrate support relative to the heater around the rotation axis.

3. The apparatus according to claim 2, wherein the first and second bearings are roller bearings defining circular and coaxial races.

4. The apparatus according to claim 1, wherein the substrate support includes a bottom wall, a jacket-shaped side wall, and an top wall, which walls are interconnected to define a generally cylindrical container, wherein an outer surface of the top wall defines the support surface of the substrate support, and wherein the container accommodates at least the heat dissipating portion of the heater.

5. The apparatus according to claim 3, wherein the substrate support includes a bottom wall, a jacket-shaped side wall, and an top wall, which walls are interconnected to define a generally cylindrical container, wherein an outer surface of the top wall defines the support surface of the substrate support, and wherein the container accommodates at least the heat dissipating portion of the heater.

6. The apparatus according to claim 5, wherein the bottom wall of the container is provided with a downwardly protruding drive shaft that defines a passage extending through said bottom wall, and wherein the first bearing engages an outer circumference of the drive shaft, and wherein the second bearing engages an inner circumference of the drive shaft.

7. The apparatus according to claim 6, wherein the container is at least partly filled with thermally insulating material that is disposed in between the bottom wall of the container and the heat dissipating portion of the heater.

8. The apparatus according to claim 7, wherein the thermally insulating material is disposed in a fixed stationary relationship with the heater.

9. The apparatus according to claim 7, further comprising a support plate that is disposed within the container at a position adjacent to but spaced apart from the bottom wall of the substrate support, wherein the support plate is provided with a support shaft that protrudes downwardly from the support plate through and coaxially with the drive shaft on the bottom wall of the container, and wherein the thermally insulating material is supported on the support plate.

10. The apparatus according to claim 9, wherein the heater includes a connecting portion that connects to the heat dissipating portion to transfer energy to the heat dissipating portion, and that extends from the heat dissipating portion, through the thermally insulating material, into the support shaft, wherein said connecting portion of the heater is embedded in the thermally insulating material, and wherein the heat dissipating portion of the heater rests on top of the thermally insulating material.

11. The apparatus according to claim 7, wherein the thermally insulating material is disposed in a stationary relationship with the container.

12. The apparatus according to claim 11, wherein the drive shaft on the bottom wall of the container is aligned with an elongate hollow heater passage that extends through the thermally insulating material along the rotation axis, and wherein the heater includes a connecting portion for transferring energy to the heat dissipating portion, which connecting portion extends freely from inside the drive shaft through the heater passage to supportingly connect to the heat dissipating portion.

13. The apparatus according to claim 1, wherein the heat dissipating portion of the heater comprises at least two independently controllable heating zones, said heating zones extending underneath different parts of the support surface.

14. The apparatus according to claim 1, wherein the substrate processing apparatus is a vertical thermal furnace, further comprising an opening via which the substrate support assembly is at least partly receivable in said reaction chamber, such that, in a received state of the substrate support assembly, a substrate or substrate carrier supported on the support surface is received in the reaction space and the substrate support assembly substantially seals said opening.

15. A method, comprising:

providing a semiconductor processing apparatus according to claim 1;

providing at least one substrate, and supporting said at least one substrate on the support surface of the substrate support, with or without through intermediation of a substrate carrier; and simultaneously heating the heater so as to make the heat dissipating portion of the heater dissipate heat, and rotating the substrate support around its rotation axis so as to rotate the at least one substrate supported on the support surface relative to the heat dissipating portion of the heater beneath it.

16. A method, comprising:

providing a semiconductor processing apparatus according to claim 2;

providing at least one substrate, and supporting said at least one substrate on the support surface of the substrate support, with or without through intermediation of a substrate carrier; and simultaneously heating the heater so as to make the heat dissipating portion of the heater dissipate heat, and rotating the substrate support around its rotation axis so as to rotate the at least one substrate supported on the support surface relative to the heat dissipating portion of the heater beneath it.

17. A method, comprising:
providing a semiconductor processing apparatus according to claim 7;
providing at least one substrate, and supporting said at least one substrate on the support surface of the substrate support, with or without through intermediation of a substrate carrier; and
simultaneously
heating the heater so as to make the heat dissipating portion of the heater dissipate heat, and
rotating the substrate support around its rotation axis so as to rotate the at least one substrate supported on the support surface relative to the heat dissipating portion of the heater beneath it.

18. A method, comprising:
providing a semiconductor processing apparatus according to claim 5;
providing at least one substrate, and supporting said at least one substrate on the support surface of the substrate support, with or without through intermediation of a substrate carrier; and
simultaneously
heating the heater so as to make the heat dissipating portion of the heater dissipate heat, and
rotating the substrate support around its rotation axis so as to rotate the at least one substrate supported on the support surface relative to the heat dissipating portion of the heater beneath it.

\* \* \* \* \*